United States Patent
Xu et al.

(10) Patent No.: US 11,545,580 B2
(45) Date of Patent: Jan. 3, 2023

(54) METAL OXIDE (MO SEMICONDUCTOR AND THIN-FILM TRANSISTOR AND APPLICATION THEREOF

(71) Applicant: SOUTH CHINA UNIVERSITY OF TECHNOLOGY, Guangzhou (CN)

(72) Inventors: Miao Xu, Guangzhou (CN); Hua Xu, Guangzhou (CN); Min Li, Guangzhou (CN); Junbiao Peng, Guangzhou (CN); Lei Wang, Guangzhou (CN); Jian Hua Zou, Guangzhou (CN); Hong Tao, Guangzhou (CN)

(73) Assignee: SOUTH CHINA UNIVERSITY OF TECHNOLOGY, Guangzhou (CN)

( * ) Notice: Subject to any disclaimer, the term of this patent is extended or adjusted under 35 U.S.C. 154(b) by 0 days.

(21) Appl. No.: 17/105,655

(22) Filed: Nov. 27, 2020

(65) Prior Publication Data

US 2021/0083126 A1    Mar. 18, 2021

Related U.S. Application Data

(63) Continuation-in-part of application No. 16/529,833, filed on Aug. 2, 2019, which is a continuation of application No. PCT/CN2017/111109, filed on Nov. 15, 2017.

(30) Foreign Application Priority Data

Sep. 25, 2020 (CN) .......................... 202011027359.X

(51) Int. Cl.
*H01L 29/78* (2006.01)
*H01L 29/786* (2006.01)
*H01L 29/66* (2006.01)

(52) U.S. Cl.
CPC .. *H01L 29/78693* (2013.01); *H01L 29/66742* (2013.01)

(58) Field of Classification Search
CPC ......... H01L 29/78693; H01L 21/02266; H01L 21/02581; H01L 21/30604
USPC .......................................................... 257/43
See application file for complete search history.

(56) References Cited

U.S. PATENT DOCUMENTS

| | | | | |
|---|---|---|---|---|
| 2008/0308796 A1* | 12/2008 | Akimoto | ........... | H01L 21/02164 257/43 |
| 2008/0308806 A1* | 12/2008 | Akimoto | ............. | H01L 29/7869 257/E33.001 |
| 2009/0294764 A1* | 12/2009 | Kim | .................. | H01L 29/78693 257/43 |

(Continued)

*Primary Examiner* — Sheikh Maruf
(74) *Attorney, Agent, or Firm* — Bayramoglu Law Offices LLC

(57) ABSTRACT

The present invention discloses a metal oxide (MO) semiconductor, which is obtained by doping a small amount of rare-earth oxide (RO) as a photo-induced carrier transportion center into an indium-containing MO semiconductor to form a $(In_2O_3)_x(MO)_y(RO)_z$ semiconductor material. According to the present invention, a charge transportion center can be formed by utilizing the characteristics that the radius of rare-earth ions is equal to that of indium ions, and 4f orbitals in the rare-earth ions and 5s orbitals of the indium ions, so as to improve the stability under illumination. The present invention further provides a thin-film transistor based on the MO semiconductor and application thereof.

10 Claims, 4 Drawing Sheets

(56) References Cited

U.S. PATENT DOCUMENTS

| | | | | |
|---|---|---|---|---|
| 2012/0012835 A1* | 1/2012 | Herman | H01L 21/02581 | 257/43 |
| 2012/0187395 A1* | 7/2012 | Koezuka | H01L 29/7869 | 257/43 |
| 2012/0315730 A1* | 12/2012 | Koezuka | H01L 29/66969 | 257/E21.409 |
| 2013/0009219 A1* | 1/2013 | Yamazaki | H01L 29/786 | 257/288 |
| 2013/0099232 A1* | 4/2013 | Cho | H01L 29/66969 | 257/E29.296 |
| 2013/0153892 A1* | 6/2013 | Sasaki | H01L 29/66969 | 257/43 |
| 2013/0320330 A1* | 12/2013 | Yamazaki | H01L 29/78648 | 257/43 |
| 2014/0138674 A1* | 5/2014 | Sato | H01L 21/02403 | 257/43 |
| 2014/0327000 A1* | 11/2014 | Tochibayashi | H01L 29/66969 | 257/43 |
| 2015/0060846 A1* | 3/2015 | Yamamoto | H01L 29/24 | 257/43 |
| 2016/0035567 A1* | 2/2016 | Sato | H01L 21/02365 | 438/46 |
| 2016/0155828 A1* | 6/2016 | Sugawara | H01L 21/02565 | 438/104 |
| 2017/0263783 A1* | 9/2017 | Yamazaki | H01L 29/78696 | |

* cited by examiner

METAL OXIDE (MO SEMICONDUCTOR AND THIN-FILM TRANSISTOR AND APPLICATION THEREOF

CROSS REFERENCE TO RELATED APPLICATIONS

The present application is a continuation-in-part-application of U.S. patent application Ser. No. 16/529,833, titled "OXIDE SEMICONDUCTOR THIN-FILM AND THIN-FILM TRANSISTOR CONSISTED THEREOF", filed on Aug. 2, 2019, which claims foreign priority to Chinese Patent Application No. 201710229199.9, filed on Apr. 10, 2017. The present application claims foreign priority to Chinese Patent Application No. 201710229199.9, filed on Apr. 10, 2017 and Chinese Patent Application No. 202011027359.X, filed on Sep. 25, 2020, where are hereby incorporated by reference in their entirety.

TECHNICAL FIELD

The present invention relates to the field of semiconductor manufacturing, in particular, to materials and device structures used for manufacturing backboards of metal oxide (MO) semiconductor thin-film transistors in flat panel display and detector applications, and in particular, to an MO semiconductor and a thin-film transistor and application thereof.

BACKGROUND

In a present MO semiconductor system, indium ion ($In^{3+}$) has a relatively large ion radius, which ensures its efficient carrier transport channel with a higher probability of orbital overlap in a multi-element metal oxide, and its 5s orbital is a main electron transport channel. However, on the one hand, due to the lower bond breaking energy of In—O after indium bonds with oxygen, a large number of oxygen vacancy defects are present in pure indium oxide ($In_2O_3$) thin-films. Oxygen vacancy is the main reason for the stability deterioration of metal oxide thin-film transistors. On the other hand, many lattice mismatches occur in indium oxide that forms a film by conventional sputtering. This makes the carrier mobility of the thin-film low, which limits its application in high-performance thin-film transistors. It is generally necessary to dope $Ga^{3+}$ ions with the same amount as $In^{3+}$ ions to regulate the oxygen vacancy. Besides, in order to ensure the performance uniformity of semiconductor devices, the MO semiconductor thin-film needs to keep an amorphous thin-film structure.

Because the crystal structure of ZnO is quite different from that of $In_2O_3$ and that of $Ga_2O_3$, doping Zn ions with the same amount as in ions in the thin-film can inhibit the crystallization of the material and keep the amorphous structure of the thin-film. Therefore, IGZO (In:Ga:Zn=1:1:1 mol) is the most widely used MO semiconductor material at present. However, IGZO also has some problems: The addition of a large number of $Ga^{3+}$ and $Zn^{2+}$ ions greatly dilutes the concentration of $In^{3+}$, thereby reducing the overlapping degree of 5s orbitals and lowering the electron mobility.

In addition, IGZO and other materials have a large number of trap states near the valence band. This leads to the generation of photo-induced carriers even if the illumination energy is lower than the band gap, resulting in the poor illumination stability of current MO semiconductors.

SUMMARY

In order to overcome the shortcomings of the prior art, the present invention provides an MO semiconductor with relatively high mobility and strong illumination stability. The MO semiconductor is formed by introducing one or more than one rare-earth oxide (RO) materials into an indium-containing MO, which forms an efficient charge transportion center by utilizing the characteristics that the radius of rare-earth ions in the RO is equal to that of indium ions in indium oxide, and the electron structure of 4f orbitals in the rare-earth ions and 5s orbitals of the indium ions, so as to improve the electrical stability, and especially the stability under illumination.

A second object of the present invention is to provide a thin-film transistor including the MO semiconductor.

A third object of the present invention is to provide application of the thin-film transistor.

The present invention is implemented by using the following technical solution:

An MO semiconductor, the MO semiconductor being obtained by doping a small amount of RO as a photo-induced carrier transportion center into an indium-containing MO—$In_2O_3$ semiconductor to form a $(In_2O_3)_x(MO)_y(RO)_z$ semiconductor material, where $x+y+z=1$, $0.5 \leq x < 0.9999$, $0 \leq y < 0.5$, and $0.0001 \leq z \leq 0.2$.

That is, the MO semiconductor is implemented by introducing the RO to a composite semiconductor based on indium oxide. By the characteristics that the radius of the rare-earth ions in the RO is equal to that of the indium ions in indium oxide, on the one hand, it can be ensured that solid solution can be formed by efficient doping without phase separation, and a small doping amount can be implemented with high efficiency; on the other hand, the doping of the RO can reduce lattice mismatch in the thin-film, so that the 5s orbitals of the indium ions can fully overlap. In addition, the polyhedral structure with face-sharing in the thin-film is the main component, which reduces the serious carrier scattering caused by the polyhedral structure with cornersharing in the pure indium oxide thin-film and ensures that the thin-film has higher carrier mobility.

Besides, an efficient charge transportion center can be formed by using the electron structure characteristics of the 4f orbitals in the rare-earth ions and the 5s orbitals of the indium ions. Under positive bias, the rare-earth ions are in a stable low-energy state. The thin-film has a high carrier concentration due to the modulation of Fermi level, which can effectively shield the carrier scattering effect caused by the transportion center, thereby having no obvious impact on electrical characteristics and the like of a device. Under negative bias, the electron orbitals of rare-earth element 4f are coupled with the 5s orbitals of indium, and the rare-earth ions are in an unstable activated state. On the one hand, this increases the off-state current of the device and enhances the scattering effect on carriers, which makes the subthreshold swing of the device slightly increase; on the other hand, when photo-induced carriers are excited by suitable light, photo-induced electrons are quickly "captured" by the activated transportation center, and the photo-induced carriers return to a "ground state" in the form of non-radiative transition through their coupling orbitals; besides, the activation center is in the activated state again. Therefore, the transportion center can provide a fast recombination channel of the photo-induced carriers and prevent their impact on I-V characteristics and stability. The stability of MO semiconductor devices under illumination is greatly improved.

Further, in the MO, M is one material selected from Zn, Ga, Sn, Ge, Sb, Al, Mg, Ti, Zr, Hf, Ta and W or any arbitrary combination of two or more thereof.

Further, the RO is one material selected from praseodymium oxide, terbium oxide, cerium oxide and dysprosium oxide or any arbitrary combination of two or more thereof, or the RO is one material selected from samarium oxide, europium oxide and ytterbium oxide or any arbitrary combination of two or more thereof.

In the selection of rare-earth elements, most elements tend to lose 3 electrons and show +3 valence. Because of Hund's rule, the three elements, $La^{3+}$, $Gd^{3+}$ and $Lu^{3+}$, have completely empty, half-full and full 4f orbitals respectively. Therefore, their valence states are very stable. If the foregoing elements are selected as doped elements, the energy of 4f electron orbitals of the rare-earth element increases after electron transfer with 5s electron orbitals of In, so that the electron transfer path is blocked, and thus the fast recombination channel of photo-induced carriers cannot be provided. $Ce^{4+}$, $Pr^{4+}$, $Tb^{4+}$ and $Dy^{4+}$ ions each tend to absorb one electron to be converted into a 3+ valence state. In addition, $Eu^{3+}$, $Sm^{3+}$ and $Yb^{3+}$ each may also absorb one electron to be converted into a 2+ valence state. Ions with electron absorbing capabilities from strong to weak are sequentially $Dy^{4+}$, $Pr^{4+}$, $Tb^{4+}$, $Ce^{4+}$, $Sm^{3+}$, $Yb^{3+}$ and $Eu^{3+}$. However, in the selection of specific doped elements, it is also necessary to consider the proportions of high-valence and low-valence ions in a compound. In a steady state, when the proportion of high-valence ions is higher, the electron transfer probability is higher. In view of this, the preferred doped elements are sequentially $Pr^{4+}$, $T^{4+}$, $Ce^{4+}$, $Dy^{4+}$, $Yb^{3+}$, $Sm^{3+}$ and $Eu^{3+}$.

Further, the photo-induced carrier transportion center is located in a region from the bottom of a conduction band of the material $(In_2O_3)_x(MO)_y(RO)_z$ to 0.8 eV below the conduction band of the $(In_2O_3)_x(MO)_y(RO)_z$.

Further, $0.001 \leq z \leq 0.1$. Preferably, $0.01 \leq z \leq 0.05$.

Further, the MO semiconductor is prepared into a film by adopting any one of a physical vapor deposition process, a chemical vapor deposition process, an atomic layer deposition process, a laser deposition process, a Reactive-Plasma Deposition (RPD) process and a solution method.

The second objective of the present invention is implemented by adopting the following technical solution:

A thin-film transistor, including a gate electrode, an active layer, an insulating layer located between the gate electrode and the active layer, a source electrode and a drain electrode electrically connected to both ends of the active layer respectively, and a spacer layer, where the active layer is the foregoing MO semiconductor.

That is, the present invention further provides the thin-film transistor composed of the active layer prepared on the basis of the MO semiconductor. The RO material is introduced into the indium-containing MO, such that the MO semiconductor forms an efficient charge transportion center by utilizing the characteristics that the radius of rare-earth ions in the RO is equal to that of indium ions in indium oxide, and the electron structure of 4f orbitals in the rare-earth ions and 5s orbitals of the indium ions, so as to improve the electrical stability, and especially the stability under illumination.

Further, the spacer layer is one layer structure selected from a silicon oxide thin-film, a silicon nitride thin-film and a silicon oxynitride thin-film prepared by plasma-enhanced chemical vapor deposition or a laminated structure composed of any arbitrary two or more thereof.

The third object of the present invention is implemented by adopting the following technical solution:

Application of the thin-film transistor in a display panel or a detector.

Compared with the prior art, the present invention has the following beneficial effects.

The present invention provides an MO semiconductor formed by introducing an RO into an indium-containing MO, which can form an efficient charge transportion center by utilizing the characteristics that the radius of rare-earth ions in the RO is equal to that of indium ions in indium oxide, and the electron structure of 4f orbitals in the rare-earth ions and 5s orbitals of the indium ions, so as to improve the electrical stability, and especially the stability under illumination.

Figure 1:
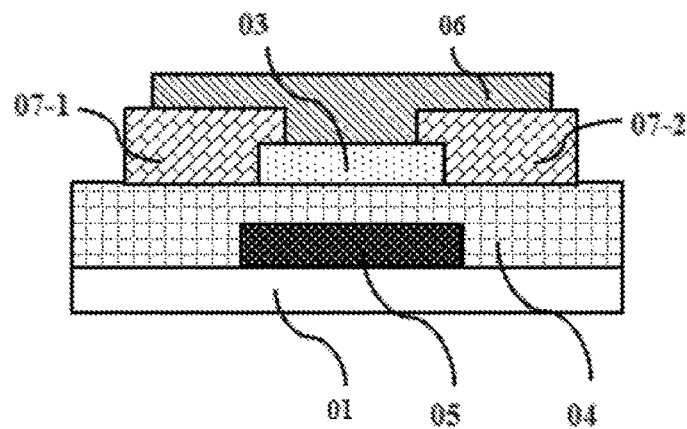
FIG. 1 is a schematic structural diagram of a thin-film transistor of example 15.

REFERENCE NUMBERS IN THE FIGURES 01. substrate; 02. buffer layer; 03. channel layer; 04. insulating layer; 05. gate electrode; 06. spacer layer; 07-1. source electrode; 07-2. drain electrode; 08. etch-stop layer.

DESCRIPTION OF EMBODIMENTS

The present invention is further described below with reference to the accompanying drawings and specific embodiments. It should be noted that all embodiments described below or all the technical features can be arbitrarily combined to form new embodiments, provided that no conflict occurs.

The following are specific embodiments of the present invention, and the raw materials, equipment, etc. used in the following embodiments can be obtained through purchase except for special restrictions.

Example 1: Praseodymium Oxide-Doped Indium Tin Zinc Oxide (ITZO) Semiconductor Material An MO semiconductor material is obtained by doping praseodymium oxide as a charge transportion center into ITZO to form a praseodymium oxide-doped ITZO (Pr:ITZO) semiconductor material.

The ratio of ingredients in ITZO is $In_2O_3:SnO:ZnO=1.5:1:1$ mol, which is marked as $In(3)Sn(1)Zn(1)$; in Pr:ITZO, the ratio of MOs is $SnO_2:ZnO=1:1$ mol, where $x=0.5$, $y=0.3333$, and $z=0.1667$. However, the present invention is not limited to the foregoing ratios. In some embodiments, $x=0.6300$, $y=0.2700$, $z=0.1000$, or, $x=0.7100$, $y=0.2400$, $z=0.0500$, or, $x=0.7800$, $y=0.2100$, $z=0.0100$, which will not be repeated herein.

Example 2: Terbium Oxide-Doped Indium Gallium Zinc Oxide (IGZO) Semiconductor Material An MO semiconductor material is obtained by doping terbium oxide as a charge transportion center into IGZO to form a terbium oxide-doped IGZO (Tb:IGZO) semiconductor material.

The ratio of ingredients in IGZO is $In_2O_3:Ga_2O_3:ZnO=2:0.5:1$ mol, which is marked as $In(4)Ga(1)Zn(1)$; in Tb:IGZO, the ratio of MOs is $Ga_2O_3:ZnO:0.5:1$ mol, where $x=0.625$, $y=0.3125$, and $z=0.0625$. However, the present invention is not limited to the foregoing ratios. In some embodiments, $x=0.8000$, $y=0.1800$, $z=0.0200$, or, $x=0.8300$, $y=0.1600$, $z=0.0100$, or, $x=0.8550$, $y=0.1400$, $z=0.0050$, which will not be repeated herein.

Example 3: Cerium Oxide-Doped Indium Oxide Semiconductor Material

An MO semiconductor material is obtained by doping cerium oxide as a charge transportion center into indium oxide ($In_2O_3$) to form an indium cerium oxide semiconductor material.

$x=0.850$, and $z=0.150$. However, the present invention is not limited to the foregoing ratios. In some embodiments, $x=0.9000$, $z=0.1000$, or, $x=0.9500$, $z=0.0500$, or, $x=0.9900$, $z=0.0100$, which will not be repeated herein.

Example 4: Dysprosium Oxide-Doped Indium Oxide Semiconductor Material

An MO semiconductor material is obtained by doping dysprosium oxide as a charge transportion center into indium oxide ($In_2O_3$) to form an indium dysprosium oxide semiconductor material.

$x=0.850$, and $z=0.150$. However, the present invention is not limited to the foregoing ratios. In some embodiments, $x=0.9000$, $z=0.1000$, or, $x=0.9500$, $z=0.0500$, or, $x=0.9900$, $z=0.0100$, which will not be repeated herein.

Example 5: Samarium Oxide-Doped Indium Zinc Oxide (IZO) Semiconductor Material An MO semiconductor material is obtained by doping samarium oxide as a charge transportion center into IZO to form a samarium oxide-doped IZO (Sm:IZO) semiconductor material.

The ratio of ingredients in the IZO target is $In_2O_3:ZnO=2:1$ mol, which is marked as $In(4) Zn(1)$; in the Sm:IZO target, $x=0.5715$, $y=0.2857$, and $z=0.1428$. However, the present invention is not limited to the foregoing ratios. In some embodiments, $x=0.7000$, $y=0.2000$, $z=0.1000$, or, $x=0.8000$, $y=0.1500$, $z=0.0500$, or, $x=0.8700$, $y=0.1200$, $r=0.0100$, which will not be repeated herein.

Example 6: Europium Oxide-Doped IZO Semiconductor Material

An MO semiconductor material is obtained by doping europium oxide as a charge transportion center into IZO to form a europium oxide-doped IZO (Eu:IZO) semiconductor material.

$x=0.800$, and $z=0.200$. However, the present invention is not limited to the foregoing ratios. In some embodiments, $x=0.9000$, $z=0.1000$, or, $x=0.9500$, $z=0.0500$, or, $x=0.9900$, $z=0.0100$, which will not be repeated herein.

Example 7: Ytterbium Oxide-Doped Indium Oxide Semiconductor Material

An MO semiconductor material is obtained by doping ytterbium oxide as a charge transportion center into indium oxide ($In_2O_3$) to form an indium ytterbium oxide semiconductor material.

$x=0.800$, and $z=0.200$. However, the present invention is not limited to the foregoing ratios. In some embodiments, $x=0.9000$, $z=0.1000$, or, $x=0.9500$, $z=0.0500$, or, $x=0.9900$, $z=0.0100$, which will not be repeated herein.

Example 8: Praseodymium Oxide-Doped ITZO Thin-Film

An MO semiconductor thin-film is formed by magnetron sputtering of the praseodymium oxide-doped ITZO semiconductor material of example 1.

Example 9: Terbium Oxide-Doped IGZO Thin-Film

An MO semiconductor thin-film is formed by magnetron sputtering of the terbium oxide-doped IGZO semiconductor material of example 2.

Example 10: Cerium Oxide-Doped Indium Oxide Thin-Film

An MO semiconductor thin-film is prepared from the cerium oxide-doped indium oxide semiconductor material of example 3 by using a solution method.

Example 11: Dysprosium Oxide-Doped Indium Oxide Thin-Film

An MO semiconductor thin-film is prepared from the dysprosium oxide-doped indium oxide semiconductor material of example 4 by using a solution method.

Example 12: Samarium Oxide-Doped IZO Thin-Film

An MO semiconductor thin-film is formed by magnetron sputtering of the samarium oxide-doped IZO semiconductor material of example 5.

Example 13: Europium Oxide-Doped IZO Thin-Film

An MO semiconductor thin-film is prepared from the europium oxide-doped IZO semiconductor material of example 6 by Reactive-Plasma Deposition (RPD).

Example 14: Ytterbium Oxide-Doped Indium Oxide Thin-Film

An MO semiconductor thin-film is prepared from the ytterbium oxide-doped indium oxide semiconductor material of example 7 by using a solution method.

Example 15: Thin-Film Transistor

A thin-film transistor has a back-channel etch structure, with the schematic structural diagram shown in FIG. 1. The thin-film transistor is provided with a substrate 01, a gate electrode 05 located on the substrate 01, an insulating layer 04 located on the substrate 01 and the gate electrode 05, a channel layer 03 covering the upper surface of the insulating layer 04 and corresponding to the gate electrode 05, a source electrode 07-1 and a drain electrode 07-2 both spaced apart from each other and electrically connected with both ends of the channel layer 03, and a spacer layer 06.

The substrate 01 is a hard alkali-free glass substrate, which is covered with a buffer layer 02 which is silicon oxide.

The gate electrode 05 has a metal copper/molybdenum (Cu/Mo) laminated structure prepared by magnetron sputtering, with a thickness of 250/20 nm.

The insulating layer 04 is a laminated structure of silicon nitride ($Si_3N_4$) and silicon oxide ($SiO_2$) prepared by chemical vapor deposition, with a thickness of 250/50 nm, where the silicon nitride is in contact with the gate electrode 05 at the lower layer and the silicon oxide is in contact with the channel layer 03 at the upper layer.

In order to test the impact of different praseodymium oxide contents on device performance, the channel layer 03 is made of the praseodymium oxide-doped ITZO semiconductor material of example 1. Two ceramic targets, ITZO and praseodymium oxide-doped ITZO (Pr:ITZO), are used to prepare thin-films with different ingredient ratios by co-sputtering and by adjusting the sputtering power of the two targets.

The source electrode 07-1 and the drain electrode 07-2 have a metal copper/molybdenum (Cu/Mo) laminated structure with a thickness of 250/20 nm. The source electrode 07-1 and the drain electrode 07-2 are patterned with a commercial hydrogen peroxide-based etchant, which has less damage to the channel layer 03 and no obvious etching residue.

The spacer layer 06 is made of silicon oxide ($SiO_2$) prepared by chemical vapor deposition with a thickness of 300 nm and a deposition temperature of 250° C.

The thin-film transistor of this embodiment may have a closed structure including only a substrate 01, a gate electrode 05, an insulating layer 04, a channel layer 03, a source electrode 07-1, a drain electrode 07-2, and a spacer layer 06, may further include a planarization layer, a reflective electrode, a pixel definite layer, etc., and may further be integrated with other devices.

The patterning process of the thin-film is implemented by photolithography combined with wet or dry etching.

In this embodiment, the specific parameters and the performance of the prepared thin-film transistor device are shown in Table 1. The characterization mode of photo-current characteristics is to irradiate the channel layer 03 of the thin-film transistor device with a commercial white LED light source (the light intensity is set to 10000 nits), evaluate the transfer characteristics of the device under illumination and under no illumination, and extract changes of threshold voltage and subthreshold swing, etc. of the device to evaluate the strength of the characteristics. When the variation range of the threshold voltage is large, it indicates that the photo-current characteristics are strong, and when the variation range of the threshold voltage is small, the photo-current characteristics are weak.

TABLE 1

| | Test | 1 | 2 | 3 | 4 | 5 | 6 | 7 |
|---|---|---|---|---|---|---|---|---|
| Praseodymium oxide content | z | 0 | 0.0001 | 0.0010 | 0.0010 | 0.0500 | 0.1000 | 0.1667 |
| Deposition conditions of the channel layer | Deposition mode | Magnetron sputtering | | | | | | |
| | $O_2(Ar + O_2)$ (%) | 20 | | | | | | |
| | Sputtering pressure (Pa) | 0.5 | | | | | | |
| | Substrate temperature (° C.) | RT | | | | | | |
| Channel layer treatment | Atmosphere annealing treatment | Air-350° C. | | | | | | |
| Composition of other film layers | Substrate | Glass | | | | | | |
| | Buffer layer | $SiO_2$ | | | | | | |
| | Gate electrode | Mo/Cu | | | | | | |
| | Gate insulating layer | $SiO_2/Si_3N_4$ | | | | | | |
| | Source electrode and drain electrode | Mo/Cu | | | | | | |
| | Spacer layer | $SiO_2$ | | | | | | |
| Passivation layer post-treatment | Atmosphere annealing treatment | Air-350° C. | | | | | | |
| Device performance | Threshold voltage $V_{th}$(V) | −6.2 | −4.2 | −2.3 | −1.1 | −0.5 | 1.3 | 2.4 |
| | Mobility $\mu$(cm$^2$ V$^{-1}$ s$^{-1}$) | 53.1 | 46.5 | 39.4 | 34.7 | 30.2 | 18.8 | 6.4 |
| | Subthreshold swing (SS) (V/decade) | 0.11 | 0.12 | 0.14 | 0.21 | 0.24 | 0.27 | 0.32 |
| | Current on/off ratio $I_{on}/I_{off}$ | $10^9$ | $10^9$ | $10^9$ | $10^9$ | $10^9$ | $10^9$ | $10^7$ |
| | Stability | Poor | Relatively poor | Good | Excellent | Excellent | Excellent | Excellent |
| | Photo-current characteristics | Extremely strong | Strong | Relatively strong | Weak | Weak | Weak | Weak |

Note:
MO in this embodiment is tin zinc oxide, where Sn/Zn = 1/1(mol).

It can be seen from Table 1 that the doping of praseodymium oxide has a very obvious impact on the device performance. The device not doped with praseodymium oxide (corresponding to z=0) has relatively high mobility, small subthreshold swing and negative threshold voltage, but its photo-current characteristics are very strong. That is, the device characteristics change obviously under the condition of light irradiation (the threshold voltage shifts negatively and the subthreshold swing degrades seriously). However, after the doping of a certain amount of praseodymium oxide, the photo-current characteristics of the device are obviously inhibited. Certainly, with the increase of the praseodymium oxide content, the mobility and other characteristics of the device are further degraded, and the photo-current characteristics are further improved. After excessive praseodymium oxide is doped (such as z=0.1667), the mobility of the device is obviously degraded. Although the photo-current characteristics of the device are extremely weak, this greatly limits its application fields. Therefore, in practical application, it is necessary to weigh the relationship between the two and select the appropriate doping amount.

Figure 4:
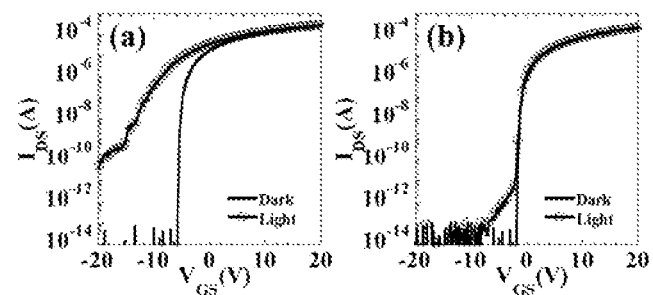
FIG. 4 is a light-response characteristic diagram of example 15.

The corresponding light-response characteristics of the device prepared in this embodiment are tested, where the z values are 0 and 0.04, respectively. As shown in FIG. 4, when light irradiates on the device, the threshold voltage of the device not doped with praseodymium oxide shifts significantly negatively. However, after a certain amount of praseodymium oxide is doped, the threshold voltage of the device has almost no change. The device shows excellent illumination stability, which corresponds to the weak photo-current characteristics in Table 1.

The test results of this embodiment show that doping a certain amount of praseodymium oxide into the ITZO matrix material can effectively improve the illumination stability of the material.

Example 16: Thin-Film Transistor

Figure 2:
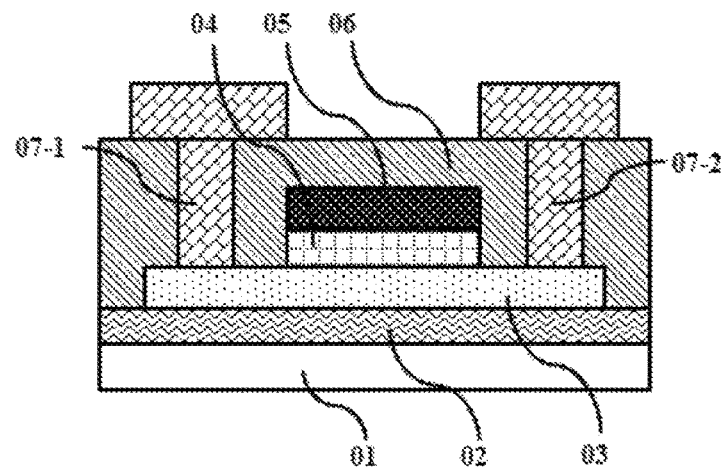
FIG. 2 is a schematic structural diagram of a thin-film transistor of example 16, example 17, example 18 and example 21.

A thin-film transistor has a top-gate self-alignment structure, with the schematic structural diagram shown in FIG. 2. The thin-film transistor is provided with a substrate 01, a buffer layer 02, a channel layer 03, an insulating layer 04 and a gate electrode 05 both located on the channel layer 03, a spacer layer 06 covering the channel layer 03 and the upper surface of the gate electrode, and a source electrode 07-1 and a drain electrode 07-2 both located on the spacer layer 06 and electrically connected with both ends of the channel layer 03.

The substrate 01 is a hard glass substrate.

The buffer layer 02 is silicon oxide prepared by plasma-enhanced chemical vapor deposition.

The channel layer 03 is made of the terbium oxide-doped IGZO semiconductor material of example 2, with a thickness of 30 nm.

The insulating layer 04 is silicon oxide with a thickness of 300 nm. The gate electrode 05 has a copper/molybdenum (Cu/Mo) laminated structure prepared by magnetron sputtering, with a thickness of 300/20 nm.

The spacer layer 06 is silicon oxide with a thickness of 300 nm.

The source electrode 07-1 and the drain electrode 07-2 each have a copper/molybdenum (Cu/Mo) laminated structure prepared by magnetron sputtering, with a thickness of 300/20 nm.

In order to test the impact of different terbium contents on device performance, the channel layer 03 is made of the terbium oxide-doped IGZO semiconductor material of example 2. Two ceramic targets, IGZO and terbium oxide-doped IGZO (Tb:IGZO), are used to prepare thin-films with different ingredient ratios by co-sputtering and by adjusting the sputtering power of the two targets.

The thin-film transistor of this embodiment may have a closed structure including only a substrate 01, a channel layer 03, an insulating layer 04, a gate electrode 05, a spacer layer 06, a source electrode 07-1 and a drain electrode 07-2, may further include a passivation layer, a pixel definite layer, etc., and may further be integrated with other devices.

The patterning of the thin-film is implemented by photolithography combined with wet or dry etching.

In this embodiment, the specific parameters and the performance of the prepared thin-film transistor device are shown in Table 2. The characterization mode of photo-current characteristics is to irradiate the channel layer of the thin-film transistor device with a commercial white LED light source, characterize the transfer characteristics of the device under different light intensity conditions, and extract changes of threshold voltage of the device to evaluate the strength of the characteristics. When the variation range of the threshold voltage is large, it indicates that the photo-current characteristics are strong, and when the variation range of the threshold voltage is small, the photo-current characteristics are weak.

TABLE 2

|  | Test | 1 | 2 | 3 | 4 | 5 | 6 | 7 |
|---|---|---|---|---|---|---|---|---|
| Terbium oxide content | z | 0 | 0.0001 | 0.0010 | 0.0050 | 0.0100 | 0.0200 | 0.0625 |
| Deposition conditions of the channel layer | Deposition mode | Magnetron sputtering | | | | | | |
| | $O_2(Ar + O_2)$ (%) | 20 | | | | | | |
| | Sputtering pressure (Pa) | 0.3 | | | | | | |
| | Substrate temperature (° C.) | RT | | | | | | |
| Channel layer treatment | Atmosphere annealing treatment | Air-350° C. | | | | | | |
| Composition of other film layers | Substrate | Glass | | | | | | |
| | Buffer layer | $SiO_2$ | | | | | | |
| | Gate insulating layer | $SiO_2$ | | | | | | |
| | Gate electrode | Mo/Cu | | | | | | |
| | Spacer layer | $SiO_2$ | | | | | | |
| | Source electrode and drain electrode | Mo/Cu | | | | | | |
| | Passivation layer | $SiO_2$ | | | | | | |

TABLE 2-continued

| | Test | 1 | 2 | 3 | 4 | 5 | 6 | 7 |
|---|---|---|---|---|---|---|---|---|
| Etch-stop layer post-treatment | Atmosphere annealing treatment | | | | Air-350° C. | | | |
| Device performance | Threshold voltage $V_{th}$(V) | −6.2 | −5.2 | −3.3 | −1.2 | −0.4 | 0.3 | 1.4 |
| | Mobility $\mu$(cm$^2$ V$^{-1}$ s$^{-1}$) | 45.1 | 42.5 | 38.4 | 35.3 | 30.2 | 28.8 | 16.4 |
| | Subthreshold swing (SS) (V/decade) | 0.1 | 0.1 | 0.12 | 0.14 | 0.16 | 0.18 | 0.22 |
| | Current on/off ratio $I_{on}/I_{off}$ | $10^9$ | $10^9$ | $10^9$ | $10^9$ | $10^9$ | $10^9$ | $10^7$ |
| | Stability | Poor | Relatively poor | Good | Excellent | Excellent | Excellent | Excellent |
| | Photo-current characteristics | Extremely strong | Strong | Relatively strong | Weak | Weak | Weak | Weak |

Note:
MO this embodiment is gallium zinc oxide, where Ga/Zn = 0.5/1(mol).

It can be seen from Table 2 that the doping of terbium oxide has a very obvious impact on the device performance. The device not doped with terbium oxide (corresponding to z=0) has relatively high mobility, small subthreshold swing and negative threshold voltage, but its photo-current characteristics are relatively strong. The device characteristics still change even if under weak illumination conditions. However, after the doping of a certain amount of terbium oxide, the photo-current characteristics of the device are obviously inhibited. Certainly, with the increase of the terbium oxide content, the mobility and other characteristics of the device are further degraded, and the photo-current characteristics are further improved. After excessive terbium oxide is doped, the mobility of the device is obviously degraded. Although the photo-current characteristics of the device are extremely weak, this greatly limits its application fields. Therefore, in practical application, it is necessary to weigh the relationship between the two and select the appropriate doping amount.

Figure 5:
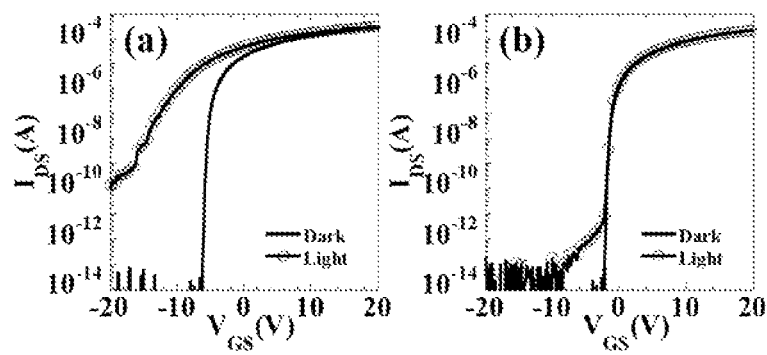
FIG. 5 is a light-response characteristic diagram of example 16.

The corresponding light-response characteristics of the device prepared in this embodiment are tested, where the y values are 0 and 0.01, respectively. As shown in FIG. 5, when light irradiates on the device, the threshold voltage of the device not doped with terbium oxide shifts significantly negatively. However, after a certain amount of terbium oxide is doped, the threshold voltage of the device has almost no change. The device shows excellent illumination stability, which corresponds to the weak photo-current characteristics in Table 2.

The test results of this embodiment show that doping a certain amount of terbium oxide into the IGZO matrix material can effectively improve the illumination stability of the material.

Example 17: Thin-Film Transistor

A thin-film transistor has a self-alignment structure, with the schematic structural diagram shown in FIG. 2. The thin-film transistor is provided with a substrate 01, a buffer layer 02, a channel layer 03, an insulating layer 04 and a gate electrode 05 both located on the channel layer 03, a spacer layer 06 covering the channel layer 03 and the upper surface of the gate electrode, and a source electrode 07-1 and a drain electrode 07-2 both located on the spacer layer 06 and electrically connected with both ends of the channel layer.

The substrate 01 is a hard glass substrate.

The buffer layer 02 is silicon oxide prepared by plasma-enhanced chemical vapor deposition.

The channel layer 03 is made of the indium cerium oxide semiconductor material of example 3, with a thickness of 20 nm.

The insulating layer 04 is silicon oxide with a thickness of 300 nm. The gate electrode 05 has a Mo/Al/Mo laminated structure prepared by magnetron sputtering, with a thickness of 50/200/50 nm.

The spacer layer 06 is a silicon oxide thin-film prepared by plasma-enhanced chemical vapor deposition, with a thickness of 300 nm.

The source electrode 07-1 and the drain electrode 07-2 each have a Mo/A/Mo laminated structure prepared by magnetron sputtering, with a thickness of 50/200/50 nm.

The thin-film transistor of this embodiment may have a closed structure including only a substrate 01, a channel layer 03, an insulating layer 04, a gate electrode 05, a spacer layer, a source electrode and a drain electrode, may further include a passivation layer, a pixel definite layer, etc., and may further be integrated with other devices.

The patterning of the thin-film is implemented by photolithography combined with wet or dry etching.

In this embodiment, the specific parameters and the performance of the prepared thin-film transistor device are shown in Table 3. The characterization mode of photo-current characteristics is to irradiate the channel layer of the thin-film transistor device with a commercial white LED light source, characterize the transfer characteristics of the device under different light intensity conditions, and extract changes of threshold voltage of the device to evaluate the strength of the characteristics. When the variation range of the threshold voltage is large, it indicates that the photo-current characteristics are strong, and when the variation range of the threshold voltage is small, the photo-current characteristics are weak.

TABLE 3

| | Test | 1 | 2 | 3 | 4 | 5 | 6 | 7 |
|---|---|---|---|---|---|---|---|---|
| Cerium oxide content | z | 0 | 0.0001 | 0.0010 | 0.0100 | 0.0500 | 0.1000 | 0.1500 |
| Deposition conditions of the channel layer | Deposition mode | | | | Solution method | | | |
| | Prebaking temperature (° C.) | | | | 120 | | | |
| Channel layer treatment | Post-annealing temperature (° C.) | | | | 400 | | | |
| Composition of other film layers | Substrate | | | | Glass | | | |
| | Buffer layer | | | | $SiO_2$ | | | |
| | Gate insulating layer | | | | $SiO_2$ | | | |
| | Gate electrode | | | | Mo/Al/Mo | | | |
| | Spacer layer | | | | $SiO_2$ | | | |
| | Source electrode and drain electrode | | | | Mo/Al/Mo | | | |
| | Passivation layer | | | | $SiO_2$ | | | |
| Gate insulating layer post-treatment | Atmosphere annealing treatment | | | | Air-350° C. | | | |
| Device performance | Threshold voltage $V_{th}$(V) | −7.2 | −5.2 | −2.3 | −0.2 | 1.4 | 2.3 | 5.4 |
| | Mobility $\mu$(cm$^2$ V$^{-1}$ s$^{-1}$) | 5.2 | 12.5 | 28.4 | 25.3 | 20.2 | 15.8 | 6.4 |
| | Subthreshold swing (SS) (V/decade) | 0.57 | 0.46 | 0.22 | 0.24 | 0.26 | 0.28 | 0.32 |
| | Current on/off ratio $I_{on}/I_{off}$ | $10^5$ | $10^6$ | $10^8$ | $10^8$ | $10^8$ | $10^7$ | $10^7$ |
| | Stability | Poor | Relatively poor | Good | Excellent | Excellent | Excellent | Excellent |
| | Photo-current characteristics | Extremely strong | Strong | Relatively strong | Weak | Weak | Weak | Weak |

Note:
No MO is present in this embodiment.

It can be seen from Table 3 that the doping of cerium oxide has a very obvious impact on the device performance. Due to the serious lattice distortion of the pure indium oxide thin-film, the mobility of the device not doped with cerium oxide (corresponding to z=0) is low, and the subthreshold swing of the device is large. Besides, its photo-current characteristics are relatively strong. The device characteristics still change even if under weak illumination conditions. However, after a certain amount of cerium oxide is doped, the characteristics of the device are obviously modified. Because cerium can improve the bonding characteristics of corner sharing in the thin-film, polyhedron components with edge sharing increase. In addition, the photo-current characteristics of the device are obviously inhibited. Certainly, with the increase of the cerium oxide content, the mobility and other characteristics of the device are degraded, and the photo-current characteristics are further improved. After excessive cerium oxide is doped (such as z=0.15), the mobility of the device is obviously degraded. Although the photo-current characteristics of the device are extremely weak, this greatly limits its application fields. Therefore, in practical application, it is necessary to weigh the relationship between the two and select the appropriate doping amount.

Figure 6:
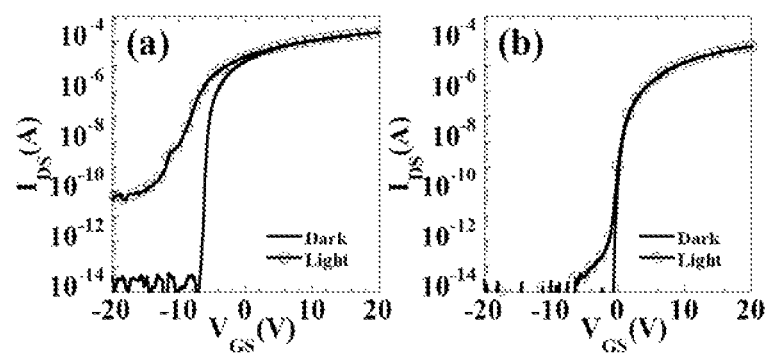
FIG. 6 is a light-response characteristic diagram of example 17.

The corresponding light-response characteristics of the device prepared in this embodiment are tested, where the z values are 0 and 0.01, respectively. As shown in FIG. 6, when light irradiates on the device, the threshold voltage of the device not doped with cerium oxide shifts significantly negatively. However, after a certain amount of cerium oxide is doped, the threshold voltage of the device has almost no change. The device shows excellent illumination stability, which corresponds to the weak photo-current characteristics in Table 3.

The test results of this embodiment show that doping a certain amount of cerium oxide into the indium oxide matrix material can effectively improve the electrical characteristics of the device, and can effectively improve the illumination stability of the material.

Example 18: Thin-Film Transistor

A thin-film transistor has a self-alignment structure, with the schematic structural diagram shown in FIG. 2. The thin-film transistor is provided with a substrate 01, a buffer layer 02, a channel layer 03, an insulating layer 04 and a gate electrode 05 both located on the channel layer 03, a spacer layer 06 covering the channel layer 03 and the upper surface of the gate electrode, and a source electrode 07-1 and a drain electrode 07-2 both located on the spacer layer 06 and electrically connected with both ends of the channel layer.

The substrate 01 is a hard glass substrate.

The buffer layer 02 is silicon oxide prepared by plasma-enhanced chemical vapor deposition.

The channel layer 03 is made of the indium dysprosium oxide semiconductor material of example 4, with a thickness of 20 nm.

The insulating layer 04 is silicon oxide with a thickness of 300 nm. The gate electrode 05 has a Mo/Al/Mo laminated structure prepared by magnetron sputtering, with a thickness of 50/200/50 nm.

The spacer layer 06 is a silicon oxide thin-film prepared by plasma-enhanced chemical vapor deposition, with a thickness of 300 nm.

The source electrode 07-1 and the drain electrode 07-2 each have a Mo/A/Mo laminated structure prepared by magnetron sputtering, with a thickness of 50/200/50 nm.

The thin-film transistor of this embodiment may have a closed structure including only a substrate, a channel layer, an insulating layer, a gate electrode, a spacer layer, a source electrode and a drain electrode, may further include a passivation layer, a pixel definite layer, etc., and may further be integrated with other devices.

The patterning of the thin-film is implemented by photolithography combined with wet or dry etching.

In this embodiment, the specific parameters and the performance of the prepared thin-film transistor device are shown in Table 4. The characterization mode of photo-current characteristics is to irradiate the channel layer of the thin-film transistor device with a commercial white LED light source, characterize the transfer characteristics of the device under different light intensity conditions, and extract changes of threshold voltage of the device to evaluate the strength of the characteristics. When the variation range of the threshold voltage is large, it indicates that the photo-current characteristics are strong, and when the variation range of the threshold voltage is small, the photo-current characteristics are weak.

Figure 7:
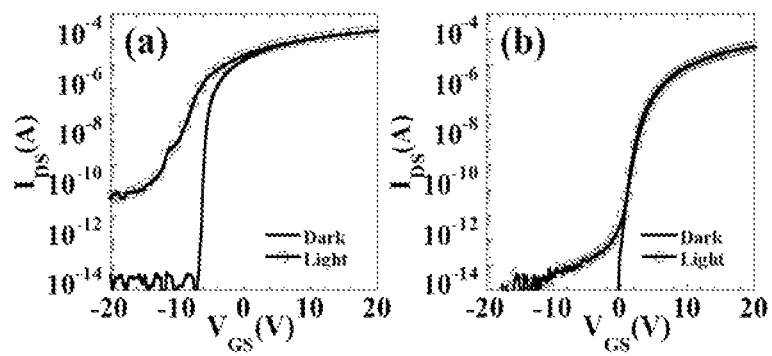
FIG. 7 is a light-response characteristic diagram of example 18.

The corresponding light-response characteristics of the device prepared in this embodiment are tested, where the z values are 0 and 0.01, respectively. As shown in FIG. 7, when light irradiates on the device, the threshold voltage of the device not doped with dysprosium oxide shifts significantly negatively. However, after a certain amount of dysprosium oxide is doped, the threshold voltage of the device has almost no change. The device shows excellent illumination stability, which corresponds to the weak photo-current characteristics in Table 4.

The test results of this embodiment show that doping a certain amount of dysprosium oxide into the indium oxide matrix material can effectively improve the electrical char-

TABLE 4

| | Test | 1 | 2 | 3 | 4 | 5 | 6 | 7 |
|---|---|---|---|---|---|---|---|---|
| Dysprosium oxide content | z | 0 | 0.0001 | 0.0010 | 0.0100 | 0.0500 | 0.1000 | 0.1500 |
| Deposition conditions of the channel layer | Deposition mode | | | | Solution method | | | |
| | Prebaking temperature (° C.) | | | | 120 | | | |
| Channel layer treatment | Post-annealing temperature (° C.) | | | | 400 | | | |
| Composition of other film layers | Substrate | | | | Glass | | | |
| | Buffer layer | | | | $SiO_2$ | | | |
| | Gate insulating layer | | | | $SiO_2$ | | | |
| | Gate electrode | | | | Mo/Al/Mo | | | |
| | Spacer layer | | | | $SiO_2$ | | | |
| | Source electrode and drain electrode | | | | Mo/Al/Mo | | | |
| | Passivation layer | | | | $SiO_2$ | | | |
| Gate insulating layer post-treatment | Atmosphere annealing treatment | | | | Air-350° C. | | | |
| Device performance | Threshold voltage $V_{th}$(V) | −7.2 | −6.5 | −3.5 | −0.1 | 1.6 | 3.6 | 5.4 |
| | Mobility $\mu$(cm$^2$ V$^{-1}$s$^{-1}$) | 5.2 | 6.5 | 30.4 | 27.3 | 21.2 | 16.3 | 4.4 |
| | Subthreshold swing (SS) (V/decade) | 0.57 | 0.43 | 0.16 | 0.21 | 0.22 | 0.28 | 0.35 |
| | Current on/off ratio $I_{on}/I_{off}$ | $10^6$ | $10^6$ | $10^8$ | $10^8$ | $10^8$ | $10^7$ | $10^7$ |
| | Stability | Poor | Relatively poor | Good | Excellent | Excellent | Excellent | Excellent |
| | Photo-current characteristics | Extremely strong | Strong | Relatively strong | Weak | Weak | Weak | Weak |

Note:
No MO is present in this embodiment.

It can be seen from Table 4 that the doping of dysprosium oxide has a very obvious impact on the device performance. Due to the serious lattice distortion of the pure indium oxide thin-film, the mobility of the device not doped with dysprosium oxide (corresponding to z=0) is low, and the subthreshold swing of the device is large. Besides, its photo-current characteristics are relatively strong. The device characteristics still change even if under weak illumination conditions. However, after a certain amount of dysprosium oxide is doped, the characteristics of the device are obviously modified. Because dysprosium can improve the bonding characteristics of corner sharing in the thin-film, polyhedron components with edge sharing increase. In addition, the photo-current characteristics of the device are obviously inhibited. Certainly, with the increase of the dysprosium oxide content, the mobility and other characteristics of the device are degraded, and the photo-current characteristics are further improved. After excessive dysprosium oxide is doped (such as z=0.15), the mobility of the device is obviously degraded. Although the photo-current characteristics of the device are extremely weak, this greatly limits its application fields. Therefore, in practical application, it is necessary to weigh the relationship between the two and select the appropriate doping amount.

acteristics of the device, and can effectively improve the illumination stability of the material.

Example 19: Thin-Film Transistor

Figure 3:
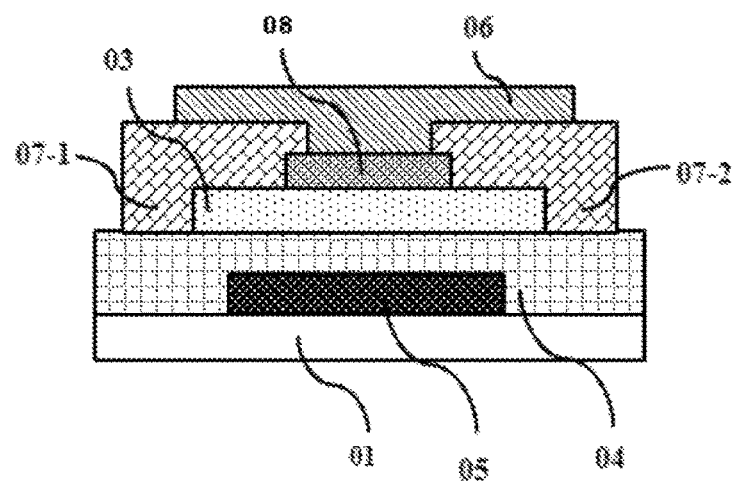
FIG. 3 is a schematic structural diagram of a thin-film transistor of example 19 and example 20.

A thin-film transistor has an etch-stop structure, with the schematic structural diagram shown in FIG. 3. The thin-film transistor is provided with a substrate 01, a gate electrode 05 located on the substrate 01, an insulating layer 04 located on the substrate 01 and the gate electrode 05, a channel layer 03 covering the upper surface of the insulating layer 04 and corresponding to the gate electrode 05, an etch-stop layer 08, a source electrode 07-1 and a drain electrode 07-2 both spaced apart from each other and electrically connected with both ends of the channel layer 03, and a spacer layer 06.

The substrate 01 is a glass substrate, which is covered with buffer layer silicon oxide.

The gate electrode 05 each have a metal Mo/Al/Mo laminated structure prepared by magnetron sputtering, with a thickness of 50/200/50 nm.

The insulating layer 04 is a laminated structure of silicon nitride ($Si_3N_4$) and silicon oxide ($SiO_2$) prepared by chemical vapor deposition, with a thickness of 250/50 nm, where the silicon nitride is in contact with the gate electrode at the lower layer and the silicon oxide is in contact with the channel layer at the upper layer.

In order to test the impact of different samarium oxide contents on device performance, the channel layer 03 is made of the samarium oxide-doped IZO semiconductor material of example 5. Two ceramic targets, IZO and samarium oxide-doped IZO (Sm:IZO), are used to prepare thin-films by co-sputtering. Thin-films with different ingredient ratios can be prepared by adjusting the sputtering power of the two targets.

The etch-stop layer 08 and the spacer layer 06 are each made of a silicon oxide ($SiO_2$) thin-film prepared by chemical vapor deposition with a thickness of 300 nm and a deposition temperature of 300° C.

The source electrode 07-1 and the drain electrode 07-2 each have a metal Mo/Al/Mo laminated structure, with a thickness of 50/200/50 nm.

In addition, the thin-film transistor of this embodiment may have a closed structure including only a substrate, a gate electrode, an insulating layer, a channel layer, an etch-stop layer, a source electrode, a drain electrode, and a passivation layer, may further include a planarization layer, a reflective electrode, a pixel definite layer, etc., and may further be integrated with other devices.

The patterning process of the thin-film is implemented by photolithography combined with wet or dry etching.

In this embodiment, the specific parameters and the performance of the prepared thin-film transistor device are shown in Table 5. The characterization mode of photo-current characteristics is to irradiate the channel layer of the thin-film transistor device with a commercial white LED light source, evaluate the transfer characteristics of the device under illumination and under no illumination, and extract changes of threshold voltage of the device to evaluate the strength of the characteristics. When the variation range of the threshold voltage is large, it indicates that the photo-current characteristics are strong, and when the variation range of the threshold voltage is small, the photo-current characteristics are weak.

TABLE 5

| | Test | 1 | 2 | 3 | 4 | 5 | 6 | 7 |
|---|---|---|---|---|---|---|---|---|
| Samarium oxide content | z | 0 | 0.0001 | 0.0010 | 0.0100 | 0.0500 | 0.1000 | 0.1428 |
| Deposition conditions of the channel layer | Deposition mode | Magnetron sputtering | | | | | | |
| | $O_2$(Ar + $O_2$) (%) | 10 | | | | | | |
| | Sputtering pressure (Pa) | 0.3 | | | | | | |
| | Substrate temperature (° C.) | 200 | | | | | | |
| Channel layer treatment | Atmosphere annealing treatment | $O_2$-350° C. | | | | | | |
| Composition of other film layers | Substrate | Glass | | | | | | |
| | Buffer layer | $SiO_2$ | | | | | | |
| | Gate electrode | Mo/Al/Mo | | | | | | |
| | Gate insulating layer | $SiO_2/Si_3N_4$ | | | | | | |
| | Etch-stop layer | $SiO_2$ | | | | | | |
| | Source electrode and drain electrode | Mo/Al/Mo | | | | | | |
| | Spacer layer | $SiO_2$ | | | | | | |
| Etch-stop layer post-treatment | Atmosphere annealing treatment | $O_2$-350° C. | | | | | | |
| Device performance | Threshold voltage $V_{th}$(V) | −5.2 | −5 | −2.6 | −1.1 | −0.1 | 1.2 | 2.4 |
| | Mobility μ($cm^2 V^{-1} s^{-1}$) | 42.8 | 40.2 | 38.4 | 36.7 | 29.2 | 20.8 | 8.4 |
| | Subthreshold swing (SS) (V/decade) | 0.1 | 0.11 | 0.12 | 0.12 | 0.14 | 0.20 | 0.26 |
| | Current on/off ratio $I_{on}/I_{off}$ | $10^9$ | $10^9$ | $10^9$ | $10^9$ | $10^9$ | $10^9$ | $10^9$ |
| | Stability | Poor | Relatively poor | Good | Excellent | Excellent | Excellent | Excellent |
| | Photo-current characieristics | Extremely strong | Strong | Relatively strong | Weak | Weak | Weak | Weak |

Note:
MO in this embodiment is zinc oxide.

It can be seen from Table 5 that the doping of samarium oxide has a very obvious impact on the device performance. The device not doped with samarium oxide (corresponding to z=0) has relatively high mobility, small subthreshold swing and negative threshold voltage, but its photo-current characteristics are very strong. That is, the device characteristics change obviously under the condition of light irradiation (the threshold voltage shifts negatively and the subthreshold swing degrades seriously). However, after the doping of a certain amount of samarium oxide, the photo-current characteristics of the device are obviously inhibited. Certainly, with the increase of the samarium oxide content, the mobility and other characteristics of the device are further degraded, and the photo-current characteristics are further improved. After excessive samarium oxide is doped (such as z=0.1428), the mobility of the device is obviously degraded. Although the photo-current characteristics of the device are extremely weak, this greatly limits its application fields. Therefore, in practical application, it is necessary to weigh the relationship between the two and select the appropriate doping amount.

Figure 8:
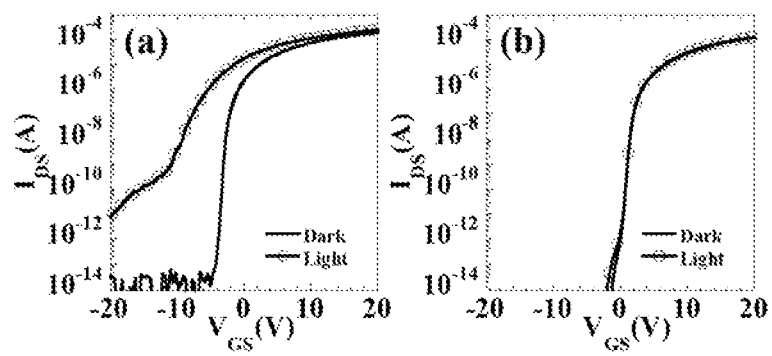
FIG. 8 is a light-response characteristic diagram of example 19.

The corresponding light-response characteristics of the device prepared in this embodiment are tested, where the z values are 0 and 0.01, respectively. As shown in FIG. 8, when light irradiates on the device, the threshold voltage of the device not doped with samarium oxide shifts significantly negatively. However, after a certain amount of samarium oxide is doped, the threshold voltage of the device has almost no change. The device shows excellent illumination stability, that is, the device corresponds to the weak photo-current characteristics in Table 5.

The test results of this embodiment show that doping a certain amount of samarium oxide into the IZO matrix material can effectively improve the illumination stability of the material.

Example 20: Thin-Film Transistor

A thin-film transistor has an etch-stop structure, with the schematic structural diagram shown in FIG. 3. The thin-film transistor is provided with a substrate 01, a gate electrode 05 located on the substrate 01, an insulating layer 04 located on the substrate 01 and the gate electrode 05, a channel layer 03 covering the upper surface of the insulating layer 04 and corresponding to the gate electrode 05, an etch-stop layer 08, a source electrode 07-1 and a drain electrode 07-2 both spaced apart from each other and electrically connected with both ends of the channel layer 03, and a spacer layer 06.

The substrate 01 is a glass substrate, which is covered with buffer layer silicon oxide.

The gate electrode 05 each have a metal Mo/Al/Mo laminated structure prepared by magnetron sputtering, with a thickness of 50/200/50 nm.

The insulating layer 04 is a laminated structure of silicon nitride ($Si_3N_4$) and silicon oxide ($SiO_2$) prepared by chemical vapor deposition, with a thickness of 250/50 nm, where the silicon nitride is in contact with the gate electrode at the lower layer and the silicon oxide is in contact with the channel layer at the upper layer.

In order to test the impact of different europium oxide contents on device performance, the channel layer 03 is made of the europium oxide-doped IZO semiconductor material of example 6. Seven corresponding ceramic targets with different ratios are prepared by doping IZO with europium oxide with different contents.

The etch-stop layer 08 and the spacer layer 06 are each made of a silicon oxide ($SiO_2$) thin-film prepared by chemical vapor deposition with a thickness of 300 nm and a deposition temperature of 300° C.

The source electrode 07-1 and the drain electrode 07-2 each have a metal Mo/Al/Mo laminated structure, with a thickness of 50/200/50 nm.

In addition, the thin-film transistor of this embodiment may have a closed structure including only a substrate 01, a gate electrode, an insulating layer, a channel layer, an etch-stop layer, a source electrode, a drain electrode, and a passivation layer, may further include a planarization layer, a reflective electrode, a pixel definite layer, etc., and may further be integrated with other devices.

The patterning process of the thin-film is implemented by photolithography combined with wet or dry etching.

In this embodiment, the specific parameters and the performance of the prepared thin-film transistor device are shown in Table 6. The characterization mode of photo-current characteristics is to irradiate the channel layer of the thin-film transistor device with a commercial white LED light source, evaluate the transfer characteristics of the device under illumination and under no illumination, and extract changes of threshold voltage of the device to evaluate the strength of the characteristics. When the variation range of the threshold voltage is large, it indicates that the photo-current characteristics are strong, and when the variation range of the threshold voltage is small, the photo-current characteristics are weak.

TABLE 6

| | Test | 1 | 2 | 3 | 4 | 5 | 6 | 7 |
|---|---|---|---|---|---|---|---|---|
| Samarium oxide content | z | 0 | 0.0001 | 0.0010 | 0.0100 | 0.0500 | 0.1000 | 0.2000 |
| Deposition conditions of the channel layer | Deposition mode | | | | RPD | | | |
| | $O_2(Ar + O_2)$ (%) | | | | 20 | | | |
| | Deposition pressure (Pa) | | | | 0.5 | | | |
| | Substrate temperature (° C.) | | | | 200 | | | |
| Channel layer treatment | Atmosphere annealing treatment | | | | N/A | | | |
| Composition of other film layers | Substrate | | | | Glass | | | |
| | Buffer layer | | | | $SiO_2$ | | | |
| | Gate electrode | | | | Mo/Al/Mo | | | |
| | Gate insulating layer | | | | $SiO_2/Si_3N_4$ | | | |
| | Etch-stop layer | | | | $SiO_2$ | | | |
| | Source electrode and drain electrode | | | | Mo/Al/Mo | | | |
| | Spacer layer | | | | $SiO_2$ | | | |
| Etch-stop layer post-treatment | Atmosphere annealing treatment | | | | Air-350° C. | | | |
| Device performance | Threshold voltage $V_{th}(V)$ | −6.2 | −5.7 | −2.6 | −1.4 | −0.2 | 17.0 | 3.4 |
| | Mobility $\mu(cm^2 V^{-1} s^{-1})$ | 52.3 | 50.2 | 38.6 | 35.7 | 26.2 | 16.8 | 6.4 |
| | Subthreshold swing (SS) (V/decade) | 0.1 | 0.11 | 0.12 | 0.12 | 0.14 | 0.22 | 0.28 |
| | Current on/off ratio $I_{on}/I_{off}$ | $10^9$ | $10^9$ | $10^9$ | $10^9$ | $10^9$ | $10^9$ | $10^9$ |
| | Stability | Poor | Relatively poor | Good | Excellent | Excellent | Excellent | Excellent |
| | Photo-current characteristics | Extremely strong | Strong | Relatively strong | Weak | Weak | Weak | Weak |

Note:
MO in this embodiment is zinc oxide.

It can be seen from Table 6 that the doping of europium oxide has a very obvious impact on the device performance. The device not doped with europium oxide (corresponding to z=0) has relatively high mobility, small subthreshold swing and negative threshold voltage, but its photo-current characteristics are very strong. That is, the device characteristics change obviously under the condition of light irradiation (the threshold voltage shifts negatively and the subthreshold swing degrades seriously). However, after the doping of a certain amount of europium oxide, the photo-current characteristics of the device are obviously inhibited. Certainly, with the increase of the europium oxide content, the mobility and other characteristics of the device are further degraded, and the photo-current characteristics are further improved. After excessive europium oxide is doped (such as z=0.2), the mobility of the device is obviously degraded. Although the photo-current characteristics of the device are extremely weak, this greatly limits its application fields. Therefore, in practical application, it is necessary to weigh the relationship between the two and select the appropriate doping amount.

Figure 9:
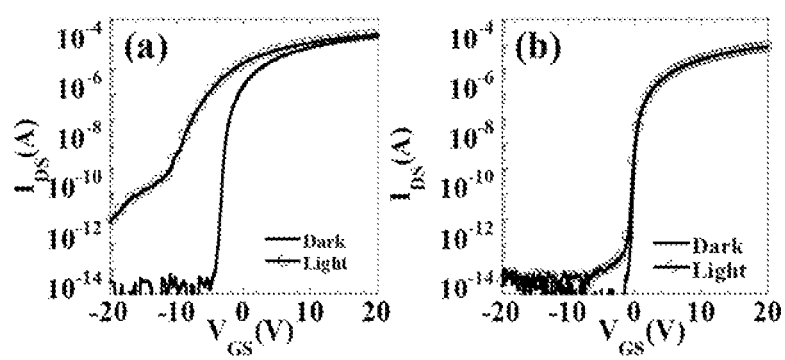
FIG. 9 is a light-response characteristic diagram of example 20.

The corresponding light-response characteristics of the device prepared in this embodiment are tested, where the z values are 0 and 0.01, respectively. As shown in FIG. 9, when light irradiates on the device, the threshold voltage of the device not doped with europium oxide shifts significantly negatively. However, after a certain amount of europium oxide is doped, the threshold voltage of the device has almost no change. The device shows excellent illumination stability, which corresponds to the weak photo-current characteristics in Table 6.

The test results of this embodiment show that doping a certain amount of europium oxide into the IZO matrix material can effectively improve the illumination stability of the material.

Example 21: Thin-Film Transistor

A thin-film transistor has a self-alignment structure, with the schematic structural diagram shown in FIG. 2. The thin-film transistor is provided with a substrate 01, a buffer layer 02, a channel layer 03, an insulating layer 04 and a gate electrode 05 both located on the channel layer 03, a spacer layer 06 covering the channel layer 03 and the upper surface of the gate electrode, and a source electrode 07-1 and a drain electrode 07-2 both located on the spacer layer 06 and electrically connected with both ends of the channel layer.

The substrate 01 is a hard glass substrate.

The buffer layer 02 is silicon oxide prepared by plasma-enhanced chemical vapor deposition.

The channel layer 03 is made of the indium dysprosium oxide semiconductor material of example 7, with a thickness of 20 nm.

The insulating layer 04 is silicon oxide with a thickness of 300 nm. The gate electrode 05 has a Mo/Al/Mo laminated structure prepared by magnetron sputtering, with a thickness of 50/200/50 nm.

The spacer layer 06 is a silicon oxide thin-film prepared by plasma-enhanced chemical vapor deposition, with a thickness of 300 nm.

The source electrode 07-1 and the drain electrode 07-2 each have a Mo/Al/Mo laminated structure prepared by magnetron sputtering, with a thickness of 50/200/50 nm.

The thin-film transistor of this embodiment may have a closed structure including only a substrate, a channel layer, an insulating layer, a gate electrode, a spacer layer, a source electrode and a drain electrode, may further include a passivation layer, a pixel definite layer, etc., and may further be integrated with other devices.

The patterning of the thin-film is implemented by photolithography combined with wet or dry etching.

In this embodiment, the specific parameters and the performance of the prepared thin-film transistor device are shown in Table 7. The characterization mode of photo-current characteristics is to irradiate the channel layer of the thin-film transistor device with a commercial white LED light source, characterize the transfer characteristics of the device under different light intensity conditions, and extract changes of threshold voltage of the device to evaluate the strength of the characteristics. When the variation range of the threshold voltage is large, it indicates that the photo-current characteristics are strong, and when the variation range of the threshold voltage is small, the photo-current characteristics are weak.

TABLE 7

| Test | | 1 | 2 | 3 | 4 | 5 | 6 | 7 |
|---|---|---|---|---|---|---|---|---|
| Ytterbium oxide content | z | 0 | 0.0001 | 0.0010 | 0.0100 | 0.0500 | 0.1000 | 0.2000 |
| Deposition conditions of the channel layer | Deposition mode | Solution method | | | | | | |
| | Prebaking temperature (° C.) | 120 | | | | | | |
| Channel layer treatment | Post-annealing temperature (° C.) | 400 | | | | | | |
| Composition of other film layers | Substrate | Glass | | | | | | |
| | Buffer layer | $SiO_2$ | | | | | | |
| | Gate insulating layer | $SiO_2$ | | | | | | |
| | Gate electrode | Mo/Al/Mo | | | | | | |
| | Spacer layer | $SiO_2$ | | | | | | |
| | Source electrode and drain electrode | Mo/Al/Mo | | | | | | |
| | Passivation layer | $SiO_2$ | | | | | | |

TABLE 7-continued

| Test | | 1 | 2 | 3 | 4 | 5 | 6 | 7 |
|---|---|---|---|---|---|---|---|---|
| Gate insulating layer post-treatment | Atmosphere annealing treatment | | | | Air-350° C. | | | |
| Device performance | Threshold voltage $V_{th}$(V) | −7.2 | −6.8 | −3.5 | −0.5 | 2.6 | 4.5 | 7.6 |
| | Mobility $\mu(cm^2\ V^{-1}\ s^{-1})$ | 5.2 | 3.5 | 28.8 | 34.3 | 25.2 | 11.3 | 1.7 |
| | Subthreshold swing (SS) (V/decade) | 0.57 | 0.59 | 0.26 | 0.18 | 0.22 | 0.28 | 0.36 |
| | Current on/off ratio $I_{on}/I_{off}$ | $10^6$ | $10^6$ | $10^8$ | $10^8$ | $10^8$ | $10^7$ | $10^7$ |
| | Stability | Poor | Relatively poor | Good | Excellent | Excellent | Excellent | Excellent |
| | Photo-current characteristics | Extremely strong | Strong | Relatively strong | Weak | Weak | Weak | Weak |

Note:
No MO is present in this embodiment

It can be seen from Table 7 that the doping of ytterbium oxide has a very obvious impact on the device performance. Due to the serious lattice distortion of the pure indium oxide thin-film, the mobility of the device not doped with ytterbium oxide (corresponding to z=0) is low, and the subthreshold swing of the device is large. Besides, its photo-current characteristics are relatively strong. The device characteristics still change even if under weak illumination conditions. However, after a certain amount of ytterbium oxide is doped, the characteristics of the device are obviously modified. Because ytterbium can improve the bonding characteristics of corner sharing in the thin-film, polyhedron components with edge sharing increase. In addition, the photo-current characteristics of the device are obviously inhibited. Certainly, with the increase of the ytterbium oxide content, the mobility and other characteristics of the device are degraded, and the photo-current characteristics are further improved. After excessive ytterbium oxide is doped (such as z=0.2), the mobility of the device is obviously degraded. Although the photo-current characteristics of the device are extremely weak, this greatly limits its application fields. Therefore, in practical application, it is necessary to weigh the relationship between the two and select the appropriate doping amount.

Figure 10:
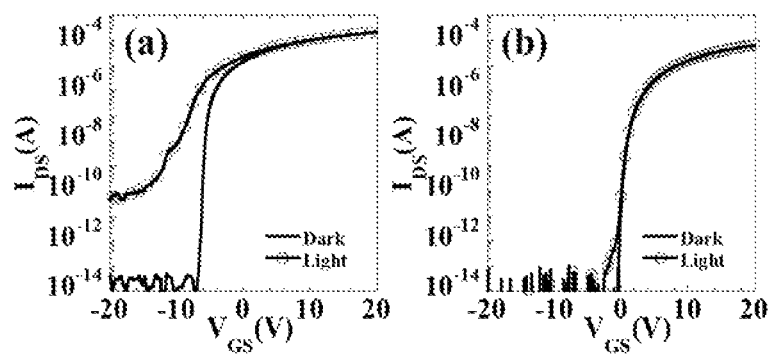
FIG. 10 is a light-response characteristic diagram of example 21.

The corresponding light-response characteristics of the device prepared in this embodiment are tested, where the z values are 0 and 0.01, respectively. As shown in FIG. 10, when light irradiates on the device, the threshold voltage of the device not doped with ytterbium oxide shifts significantly negatively. However, after a certain amount of ytterbium oxide is doped, the threshold voltage of the device has almost no change. The device shows excellent illumination stability, which corresponds to the weak photo-current characteristics in Table 7.

The test results of this embodiment show that doping a certain amount of ytterbium oxide into the indium oxide matrix material can effectively improve the electrical characteristics of the device, and can effectively improve the illumination stability of the material.

It should be pointed out that in examples 15-21, unless otherwise specified, each channel layer has a thickness of 30 nm, the oxygen content in the sputtering atmosphere is 20%, the sputtering pressure is 0.5 Pa, and the substrate temperature is set to room temperature. Before patterning, the thin-film is annealed in a high temperature oven at 350° C. in air atmosphere for 30 minutes. The ingredient ratios of thin-films are calibrated by X-ray photoelectron spectroscopy combined with characterization results of a transmission electron microscope, etc., and some thin-films with very little content are known by sputtering power reasoning.

Example 22: Display Panel

A display panel includes the thin-film transistor in each of examples 15-21, and the thin-film transistor is configured to drive a display unit in the display panel.

Example 23: Detector

A detector includes the thin-film transistor in each of examples 15-21, and the thin-film transistor is configured to drive a detection unit of the detector.

Each functional layer of the thin-film transistor implemented by the present invention is further described below.

The substrate in the present invention is not particularly limited, and a substrate well known in the art can be used. For example, the substrate is made of hard alkali glass, alkali-free glass, quartz glass, or silicon; or may be made of flexible polyimide (PI), polyethylene naphthalate (PEN), polyethylene terephthalate (PET), polyethylene (PE), polypropylene (PP), polystyrene (PS), polyether sulfone (PES) or a metal sheet.

The materials of the gate electrode in the present invention are not particularly limited, and may be arbitrarily selected from materials well known in the art. For example, the materials are transparent conducting oxides (ITO, AZO, GZO, IZO, ITZO, FTO, etc.), metals (Mo, Al, Cu, Ag, Ti, Au, Ta, Cr, Ni, etc.) and alloys thereof, metals and oxides (ITO/Ag/ITO, IZO/Ag/IZO, etc.), or composite conductive thin-films formed by stacking metals (Mo/Al/Mo, Ti/Al/Ti, etc.).

The methods for preparing gate electrode thin-films may be sputtering, electroplating, thermal evaporation and other deposition methods, and preferably sputtering deposition. Because the thin-films prepared by this method have good adhesion to a substrate and excellent uniformity, the thin-films can be prepared in a large area.

Here, the specific structure of the gate electrode needs to be determined according to the technical parameters to be achieved. For example, if a transparent electrode needs to be used in transparent display, single-layer ITO may be used as the gate electrode or ITO/Ag/ITO may be used as the gate electrode. In addition, if a high temperature process is needed in the application in special fields, a metal alloy thin-film which can resist high temperature may be selected as the gate electrode.

The materials of the insulating layer in the present invention are not particularly limited, and may be arbitrarily selected from materials well known in the art. For example, the materials are silicon oxide, silicon nitride, alumina, tantalum oxide, hafnium oxide, yttrium oxide, and polymer organic film layers.

It should be pointed out that the components of these insulating thin-films may be inconsistent with a theoretical stoichiometric ratio. In addition, the insulating layer may be formed by stacking various insulating films, which can implement better insulating characteristics and improve the interface characteristics between the channel layer and the insulating layer. Moreover, the insulating layer may be prepared in various ways, such as physical vapor deposition, chemical vapor deposition, atomic layer deposition, laser deposition, anodic oxidation or a solution method.

The etchant used in wet etching includes a mixed solution of phosphoric acid, nitric acid and glacial acetic acid or a mixed solution based on hydrogen peroxide. The etching rate of an MO semiconductor material in a hydrogen peroxide-based etchant is less than 1 nm/min. Dry etching, for example, may be implemented by plasma etching, and an etching gas includes a chlorine-based or fluorine-based gas.

In the process of adopting vacuum magnetron sputtering for MO semiconductor materials, single-target sputtering or multi-target co-sputtering may be adopted, and single-target sputtering is preferred.

This is because the single-target sputtering can implement a thin-film with better repeatability and stability, and the microstructure of the thin-film is easier to control. This is unlike a co-sputtering thin-film in which sputtered particles are subjected to interference by more factors in the process of recombination.

In the vacuum sputtering deposition process, a power supply may be radio frequency (RF) sputtering, direct current (DC) sputtering or alternating current (AC) sputtering, and the AC sputtering commonly used in industry is preferred.

In the sputtering deposition process, the sputtering pressure may be selected from a range of 0.1-10 Pa, preferably 0.3-0.7 Pa.

When the sputtering pressure is excessively low, stable glow sputtering cannot be maintained. When the sputtering pressure is excessively high, the scattering and energy loss of sputtered particles in the process of deposition on a substrate increase obviously, so that the kinetic energy decreases after the sputtered particles reach the substrate, and defects of formed thin-films increase, thereby seriously affecting the performance of a device.

In the sputtering deposition process, the oxygen partial pressure is optional in the range of 0-1 Pa, preferably 0.001-0.5 Pa, and more preferably 0.01-0.1 Pa.

Oxygen partial pressure generally has a direct impact on the carrier concentration of a thin-film in the process of preparing an oxide semiconductor by sputtering, and some defects related to oxygen vacancies may be introduced. Excessively low oxygen content may cause serious oxygen mismatch and increase of carrier concentration in the thin-film, while excessively high oxygen vacancies may cause more weak bonds and reduce the reliability of the device.

In the sputtering deposition process, the substrate temperature is preferably 200-300° C.

In the process of channel layer thin-film deposition, a certain substrate temperature can effectively improve the bonding mode of sputtered particles after the sputtered particles reach the substrate, thereby reducing the probability of occurrence of weak bonds, and improving the stability of the device. Certainly, the same effect can also be achieved by subsequent annealing treatment and other processes.

The thickness of the channel layer is optional in the range of 2-100 nm, preferably 5-50 nm, and more preferably 20-40 nm.

The materials of the source electrode and the drain electrode in the present invention are not particularly limited, and may be arbitrarily selected from materials well known in the art on the premise that the implementation of devices with various required structures is not affected. For example, the materials are transparent conducting oxides (ITO, AZO, GZO, IZO, ITZO, FTO, etc.), metals (Mo, Al, Cu, Ag, Ti, Au, Ta, Cr, Ni, etc.) and alloys thereof, metals and oxides (TO/Ag/ITO, IZO/Ag/IZO, etc.), or composite conductive thin-films formed by stacking metals (Mo/Al/Mo, Ti/Al/Ti, etc.).

The methods for preparing thin-films of the source electrode and the drain electrode may be sputtering, thermal evaporation and other deposition methods, and preferably sputtering deposition. Because the thin-films prepared by this method have good adhesion to a substrate and excellent uniformity, the thin-films can be prepared in a large area.

Here, it should be noted that in the preparation of a device with a back-channel etch structure, the source electrode, the drain electrode and the channel layer need to have a proper etching selectivity, otherwise the device cannot be prepared. The etchant for wet etching in the embodiment of the present invention is an etchant (such as hydrogen peroxide-based etchant) based on conventional metals in industry. This is mainly because the MO semiconductor material of the present invention can effectively resist the etching of the wet hydrogen peroxide-based etchant, and has a high etching selectivity with metals (such as molybdenum, molybdenum alloy, and molybdenum/aluminum/molybdenum). The MO semiconductor layer is basically not affected by the etchant, and the prepared device has excellent performance and good stability. In addition, the dry etching in the embodiment of the present invention is based on conventional etching gases (such as chlorine-based gases and fluorine-based gases) in industry, and has little impact on the oxide semiconductor layer of the present invention, so the prepared device has excellent performance and good stability.

The materials of the passivation layer in the present invention are not particularly limited, and may be arbitrarily selected from materials well known in the art. For example, the materials are silicon oxide, silicon nitride, alumina, tantalum oxide, hafnium oxide, yttrium oxide, and polymer organic film layers.

It should be pointed out that the components of these insulating thin-films may be inconsistent with a theoretical stoichiometric ratio. In addition, the insulating layer may be formed by stacking various insulating films, which can implement better insulating characteristics and improve the interface characteristics between the channel layer and the passivation layer. Moreover, the passivation layer may be prepared in various ways, such as physical vapor deposition, chemical vapor deposition, atomic layer deposition, laser deposition, or a solution method.

The processing technology in the thin-film transistor preparation process implemented by the present invention is further described below.

Relatively, because of the participation of high-energy plasma, the deposition rate of thin-films prepared by sputtering is generally faster. There is no enough time to perform the relaxation process of the thin-films during the deposition process. This may result in dislocation in a certain proportion and stress remaining in the thin-films. This requires post heat annealing treatment to continue to achieve the required relatively steady state and improve the properties of the thin-films.

In the implementation of the present invention, annealing treatment is mostly set after the deposition of the channel layer and after the deposition of the passivation layer. On the one hand, the annealing treatment after the deposition of the channel layer can effectively improve in-situ defects in the channel layer and improve the ability of the channel layer to resist possible damage in the subsequent process. On the other hand, in the subsequent passivation layer deposition process, due to the participation of plasma and the modification of active groups, this may require an "activation" process to further eliminate the effects of an interface state, some donor doping, etc.

In addition, in the implementation of the present invention, the treatment modes may include not only heating treatment, but also plasma treatment interfaces (such as an insulating layer/semiconductor interface and a channel layer/passivation layer interface).

The foregoing treatment processes can effectively improve the performance and stability of the device.

The foregoing embodiments are preferred embodiments of the present invention. However, the embodiments of the present invention are not limited by the foregoing embodiments. Any other changes, modifications, replacements, combinations and simplifications made without departing from the spirit and principle of the present invention should all be equivalent replacement manners, and fall within the protection scope of the present invention.

What is claimed is:

1. A metal oxide (MO) semiconductor, wherein the MO semiconductor is obtained by doping an amount of rare-earth oxide (RO) as a photo-induced carrier transportion center into an indium-containing MO—$In_2O_3$ semiconductor to form a $(In_2O_3)_x(MO)_y(RO)_z$ semiconductor material, wherein $x+y+z=1$, $0.5 \leq x < 0.9999$, $0 \leq y < 0.5$, and $0.0001 \leq z \leq 0.2$, and the photo-induced carrier transportion center is located in a region from a bottom of a conduction band of the $(In_2O_3)_x(MO)_y(RO)_z$ semiconductor material to 0.8 eV below the conduction band of the $(In_2O_3)_x(MO)_y(RO)_z$ semiconductor material.

2. The MO semiconductor of claim 1, wherein in the MO, M is at least one material selected from the group consisting of Zn, Ga, Sn, Ge, Sb, Al, Mg, Ti, Zr, Hf, Ta and W.

3. The MO semiconductor of claim 1, wherein the RO is at least one material selected from the group consisting of praseodymium oxide, terbium oxide, cerium oxide and dysprosium oxide, or the RO is at least one material selected from the group consisting of samarium oxide, europium oxide and ytterbium oxide.

4. The MO semiconductor of claim 1, wherein $0.001 \leq z \leq 0.1$.

5. The MO semiconductor of claim 4, wherein $0.01 \leq z \leq 0.05$.

6. The MO semiconductor of claim 1, wherein the MO semiconductor is prepared into a film by adopting any one of a physical vapor deposition process, a chemical vapor deposition process, an atomic layer deposition process, a laser deposition process, a Reactive-Plasma Deposition (RPD) process and a solution method.

7. A thin-film transistor, comprising
a gate electrode,
an active layer,
an insulating layer located between the gate electrode and the active layer,
a source electrode and
a drain electrode electrically connected to both ends of the active layer respectively, and a spacer layer, wherein the active layer is the MO semiconductor of claim 1.

8. The thin-film transistor of claim 7, wherein the spacer layer is at least one layer structure selected from the group consisting of a silicon oxide thin-film, a silicon nitride thin-film and a silicon oxynitride thin-film prepared by plasma-enhanced chemical vapor deposition or a laminated structure.

9. The thin-film transistor of claim 7 is in a display panel or a detector.

10. The MO semiconductor of claim 1, wherein the semiconductor is aluminum free.

* * * * *